United States Patent
Tsai et al.

[19]

[11] Patent Number: 6,020,255
[45] Date of Patent: Feb. 1, 2000

[54] DUAL DAMASCENE INTERCONNECT PROCESS WITH BORDERLESS CONTACT

[75] Inventors: Chao-Chieh Tsai, Taichung, Taiwan; Chin-Hsiung Ho, Sunnyvale, Calif.; Yuan-Chen Sun, Katonah, N.Y.

[73] Assignee: Taiwan Semiconductor Manufacturing Company, Hsin-Chu, Taiwan

[21] Appl. No.: 09/114,131

[22] Filed: Jul. 13, 1998

[51] Int. Cl.[7] .............................................. H01L 21/4763
[52] U.S. Cl. ...................... 438/618; 438/620; 438/624; 438/626; 438/628; 438/633; 438/637; 438/638; 438/644; 438/654; 438/671; 438/672
[58] Field of Search ..................... 438/618, 620, 438/624, 626, 628, 633, 637, 638, 644, 654, 671, 672

[56] References Cited

U.S. PATENT DOCUMENTS

| | | | |
|---|---|---|---|
| 5,244,837 | 9/1993 | Dennison | 437/195 |
| 5,422,309 | 6/1995 | Zettler et al. | 437/192 |
| 5,466,636 | 11/1995 | Cronin et al. | 437/187 |
| 5,529,953 | 6/1996 | Shoda | 437/189 |
| 5,565,707 | 10/1996 | Colgan et al. | 257/762 |
| 5,604,156 | 2/1997 | Cheng | 437/195 |
| 5,654,589 | 8/1997 | Huang et al. | 257/763 |
| 5,891,799 | 4/1999 | Tsui | 438/624 |
| 5,925,933 | 7/1999 | Colgan et al. | 257/762 |
| 5,935,868 | 8/1999 | Fang et al. | 438/692 |
| 5,946,601 | 8/1999 | Wong et al. | 438/783 |

OTHER PUBLICATIONS

Chang et al, "VLSI Technology" The McGraw–Hill Companies Inc. 1996, p 446–447.

*Primary Examiner*—Joni Chang
*Assistant Examiner*—Lynne A. Gurley
*Attorney, Agent, or Firm*—George O. Saile; Stephen B. Ackerman

[57] ABSTRACT

A dual damascene process is disclosed for forming contact and via interconnects without borders. A nitride layer is first formed on a dielectric layer to function as a hard-mask. Metal line trench is first etched into the nitride layer and then into the dielectric layer. Then, a second photoresist layer is used to pattern contact or via hole over line trench opening and the dielectric layer is further etched through the line trench into the dielectric layer until the substructure of the substrate is reached. It is disclosed that by using the nitride layer as a hard-mask, the registration or alignment tolerance between the contact/via hole pattern and the metal line pattern can be relaxed substantially and not use a border as is conventionally practiced in order to assure proper registration between the patterns. The borderless interconnect is achieved by filling the composite line opening and the hole opening with metal and chemical mechanical polishing. The process enables cost reduction and productivity in the semiconductor manufacturing line.

32 Claims, 4 Drawing Sheets

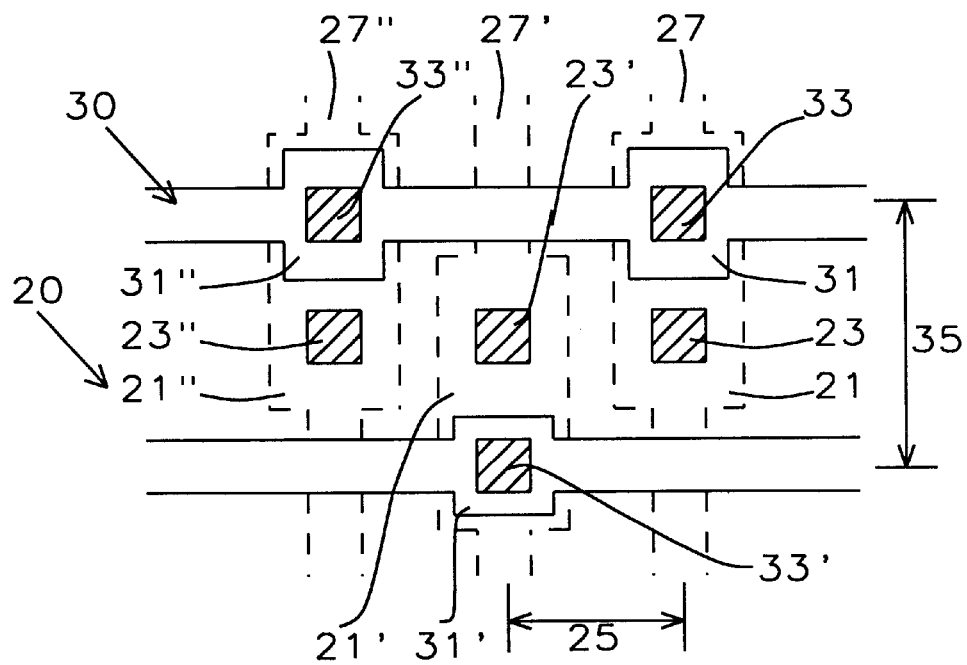
FIG. 1a – Prior Art
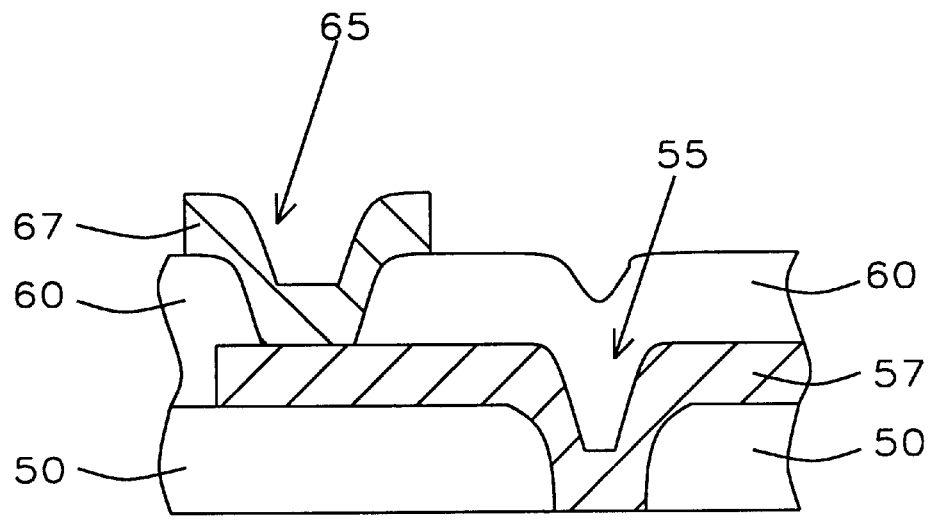
FIG. 1b – Prior Art

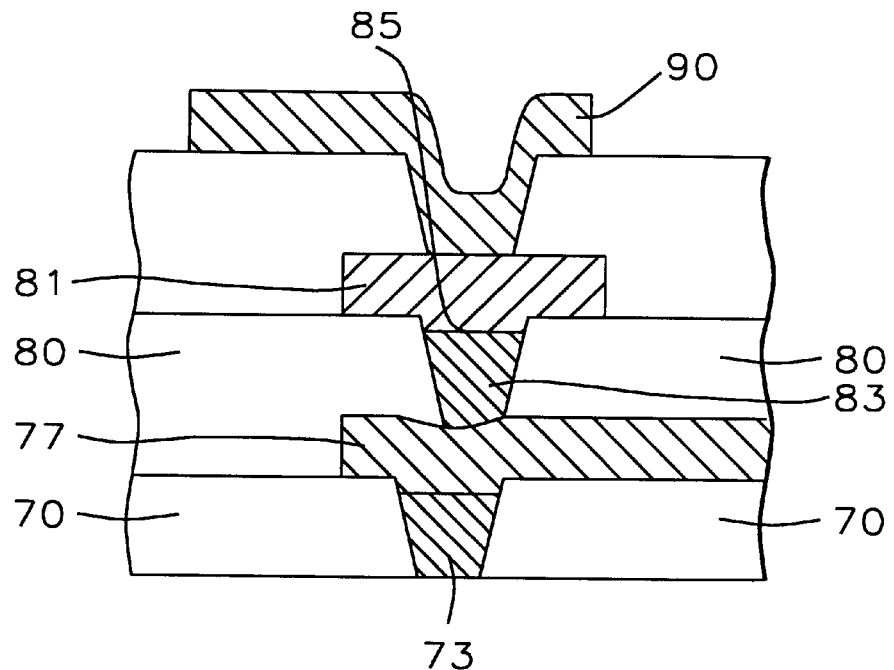
FIG. 1c – Prior Art
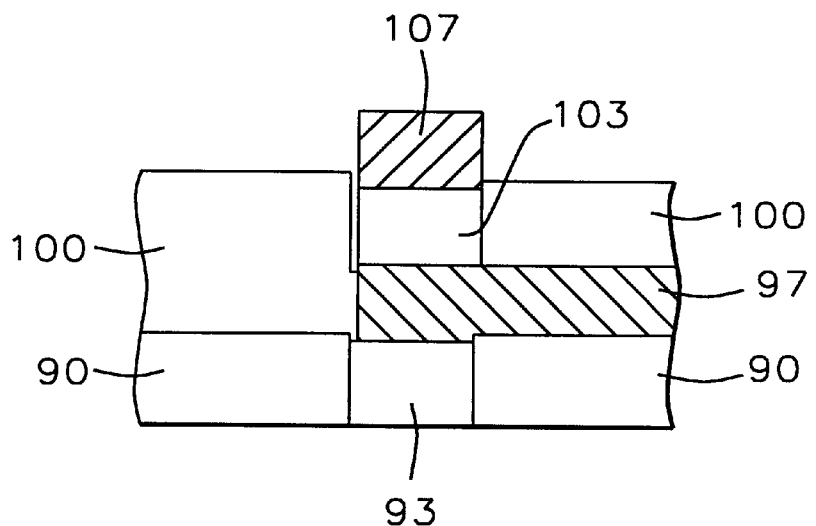
FIG. 2a

DUAL DAMASCENE INTERCONNECT PROCESS WITH BORDERLESS CONTACT

BACKGROUND OF THE INVENTION (1) Field of the Invention

The present invention relates to the manufacture of ultra large scale integrated (ULSI) circuit chips in general, and in particular, to forming interconnects in a semiconductor substrate by using a dual damascene interconnect process with borderless contact.

(2) Description of the Related Art

As the very large and ultra large scale integration (VLSI and ULSI) of circuits progresses to even smaller feature sizes less than half micron, one of the most important challenges to be overcome is the level-to-level alignment in lithography, especially that of complex structures of metal line and contact interconnects. The packing density of circuits is limited to a large extent by how closely the interconnect metal between circuits can be formed without encroaching on each other. As is well known in the field, the limits are dictated by design rules that govern the separation of one level of contact from another, and by design rules for nesting tolerance or for borders used around contacts. The present invention discloses a method for forming interconnects without borders, taking advantage of a dual damascene process. The method is equally applicable to either a metal plug formed through a contact hole over a device in a substrate, or through a via hole connecting two metal layers at different levels in a substrate. It will be known to those skilled in the art that contacts refer to an interconnect which interconnects a source-drain device region, salicide of polysilicon to metal, while vias refer to an interconnect which connects metal to metal.

The effect on packing density of borders around contacts is well illustrated by S. M. Sze, et al., in an article published in ULSI Technology. FIGS. 1a, 2c in the drawings, adapted from Sze, show a gain of more than 62% in the packing area in going from a contact having borders to no borders. FIG. 1a shows fully bordered, staggered vias (23) and (33) formed between metal layers (20) and (30). Metal layers have been patterned to form metal lines (27) at the lower level and metal lines (37) on the upper level. Single and double primed reference numerals (27) and (37) refer to other metal lines at the respective levels (20) and (30), respectively. Via (33) on the upper level has border (31) and via (23) on the lower level has its border (21). Ideally, the pitch between metal lines such as (35) for the upper metal lines and (25) for the lower metal lines, is determined by the minimum line and space dimensions that can be patterned using the most recent advances in lithographic techniques. In practice, line pitch is also limited by the via size and the underlying metal pad size forming the border around the via, such as (31) and (21). It will be known by those skilled in the art that a border around a via is needed, for otherwise, grooves would be etched into the underlying insulating layer during the via-etch step, thus causing a thinning of the next level of metal deposited over the via. The minimum dimension by which the metal pad must frame the via, that is, form a border, is dependent on the misalignment tolerances of the lithography step.

Furthermore, the slope of the via wall must be taken into account when determining the minimum pitch between vias. Sloped walls are needed so that the vias can be filled more easily with metal, and without any voids inside the via holes. Also, appropriate slope is needed for adequate metal coverage over the step of the edge of the via hole when physical vapor deposition is employed. The step coverage is in turn dependent upon the aspect ratio, that is, depth over the width of the via hole. A cross-sectional view of vias (55) and (65) with sloped walls (57) and (67), respectively, is shown in FIG. 1b. It will be noted that the more is the slope of the via wall, the larger the border must be for the metal pad over the lower via to insure full coverage of the via.

It is also noted that the vias of FIG. 1a and FIG. 1b are formed laterally with respect to each other. That is, they are staggered rather than being stacked on top of one another as shown in FIG. 1c. The pitch between staggered vias can be reduced if the borders around the vias can also be reduced. The borders can be reduced if the slope of the walls can be reduced. The slope can be reduced if the holes can be filled properly with walls approaching vertical orientation. As is known in the art, forming metal plugs, such as tungsten plugs, in via holes separate from forming metal lines makes vertical vias possible. Plug forming methods are advantageous also in filling contact or via holes of different cross-sectional areas, though they may not fill the openings up to the top. This is shown by reference numerals (75) and (85) in FIG. 1c where vias (73) and (83) have more steeply sloped walls, and they span, respectively, insulation layers (70) and (80).

Vias with vertical walls, and with no borders, can also be made, as disclosed later in this invention and as depicted in FIG. 2a. In FIG. 2a, vertical vias (93) and (103) are formed in insulating layers (90) and (100), respectively, connecting two metal layers (97) and (107). Thus, the minimum distance, such as (25) and (35) in FIG. 2b, between adjacent metal lines, is reduced since the vias have no slope. Secondly, the borders are no longer needed, since plugs (23), (33) in the completely filled vias provide ample overetch protection to underlying metal structures without mask coverage, as it will be appreciated by those skilled in the art. Even with borderless vias only, then, there is substantial reduction in the area occupied by these vias as shown in FIG. 2b in comparison with vias with borders of FIG. 1a. Hence, the pitch (35') between adjacent lines (37) and (37') can be reduced. The line pitch can be further reduced if the vias are stacked on top of one another as shown in FIG. 2c where upper vias (23), (23') and (23") are stacked on top of lower vias (33), (33') and (33"), thus significantly reducing upper metal line pitch from (35) to (35"), and lower metal line pitch from (25) to (25"). Hence, significant gains in packing density can be achieved with stacked and borderless contacts or vias.

However, the practice of stacking contacts and borderless contacts is still in its infancy, as observed by Sze in the earlier Reference. Conventionally, the metal layers and the interconnecting layers are formed separately, and serially. First, a first blanket metal is deposited on a first insulating layer and electrical lines are formed by subtractive etching of the metal through a first mask. A second insulating layer is formed over the first metallized layer, and the second insulating layer is patterned with contact or via holes using a second mask. The holes are then filled with metal, thus forming metal columns, or plugs, contacting the first metal layer. A second blanket metal layer is formed over the second insulating layer containing the columnar plugs which now connect the upper second metal layer with the lower first metal layer. The second metal layer is next patterned with another mask to form a set of new metal lines, and the process is repeated as many times as it is needed to fabricate a semiconductor substrate. With this conventional process, lithographic alignment tolerances must be held very tight in order to form reliable borderless contacts or vias.

On the other hand, forming plugs and metal lines simultaneously, as in the modified dual damascene process disclosed in this invention, some of the misalignment problems can be overcome. In the standard dual damascene process the insulating layer is coated with a resist material which is exposed to a first mask with the image pattern of the via opening and the pattern is anisotropically etched in the upper half of the insulating layer. After removal of the patterned resist material, the insulating layer is coated with another resist material which is exposed to a second mask with image pattern of the conductive lines in alignment with the via openings. In anisotropically etching the openings for the conductive line in the upper half of the insulating material, the via openings already present in the upper half are simultaneously etched in the lower half of the insulating material. After the etching is complete, both the vias and grooves are filled with metal. Though the alignment of contact or via holes with respect to the metal lines is improved, the standard dual damascene is still difficult to practice in forming borderless contacts and vias for metal pitches of sub-half micron, and with copper metal.

Some of the difficulties in forming borderless contacts have been addressed in prior art. For example, Huang, et al., in U.S. Pat. No. 5,654,589 use a landing pad both as a local interconnect and borderless contact. Huang teaches the forming of Ti/TiN stack interconnect structures that can be used as local interconnects and contact landing pads on the same level. The contact landing pads facilitate the use of borderless contact approach. In U.S. Pat. No. 5,466,636, Cronin, et al., show a method of forming borderless contacts using a removable mandrel. Zettler, et al., (U.S. Pat. No. 5,422,309) teach the forming of a metallization level having contacts and interconnects connecting the contacts. Shoda of U.S. Pat. No. 5,529,953 discloses a method of forming studs and interconnects in a dual damascene structure, while Chung, et al., of U.S. Pat. No. 5,604,156 teach a dual damascene process for forming a wiring. These all differ from the present invention where a method of forming stacked, borderless contacts and vias is disclosed using a modified dual damascene process.

SUMMARY OF THE INVENTION

It is therefore an object of the present invention to provide method of forming self-aligned and borderless contacts using a dual damascene interconnect process.

It is also an object of the present invention to provide method of forming self-aligned and borderless vias using a dual damascene interconnect process.

It is another object of this invention to provide a method of forming self-aligned and borderless contact and vias with relaxed photolithographic alignment tolerances.

These objects are accomplished by providing a semiconductor substrate having a substructure comprising devices and/or metal layers formed in said substrate; forming an insulating dielectric layer over said substrate; performing chemical mechanical polishing of said dielectric layer; forming a hard-mask layer over said dielectric layer; forming a first photoresist layer over said dielectric layer; patterning said first photoresist layer with a metal line pattern; etching through said metal line pattern in said first photoresist layer into said hard-mask layer; etching further said metal line pattern into said dielectric layer; removing said first photoresist layer from said substrate; forming a second photoresist layer over said substrate including said metal line opening; patterning said second photoresist layer with a contact or via hole pattern; etching through said contact hole pattern in said second photoresist layer into said dielectric layer until a lower level said substructure of said substrate is reached; removing said second photoresist layer; forming a glue layer over said substrate including said metal line and contact hole opening forming a composite opening; forming metal in said composite opening in said dielectric layer; and removing said metal from the surface of said substrate for subsequent process steps to complete the fabrication of a semiconductor substrate.

BRIEF DESCRIPTION OF THE DRAWINGS

FIGS. 1a shows a layout of two levels of metal lines on a semiconductor substrate and interconnected by means of staggered vias having sloped walls and borders, as practiced in prior art.

FIG. 1b shows a staggered vias having sloped walls of prior art.

FIG. 1c shows stacked vias with borders of prior art.

FIG. 2a shows borderless, vertical stacked vias of this invention.

DESCRIPTION OF THE PREFERRED EMBODIMENTS

Referring now the drawings, in particular to FIGS. 3a–3f, there is shown a method of forming self-aligned and borderless interconnects, specifically, contacts and vias, using a dual damascene interconnect process. The dual damascene process is used on a substrate (110) provided with a substructure of devices formed in the substrate and/or metal layers thereof, and as they are not significant to the invention, they are not described in detail in order not to unnecessarily obscure the present invention. It will be understood by those skilled in the art that contacts are formed in an insulating interlevel dielectric (ILD) layer in which the contacts provide connections between a source-drain, salicide or polysilicon to a metal layer, while vias are formed within upper dielectric layers referred to as intermetal dielectric (IMD) layer providing connection between metal layers. Since the present invention is applicable to both types of interconnects, they will be referred to, together, as contact/via interconnects.

Figure 2B:
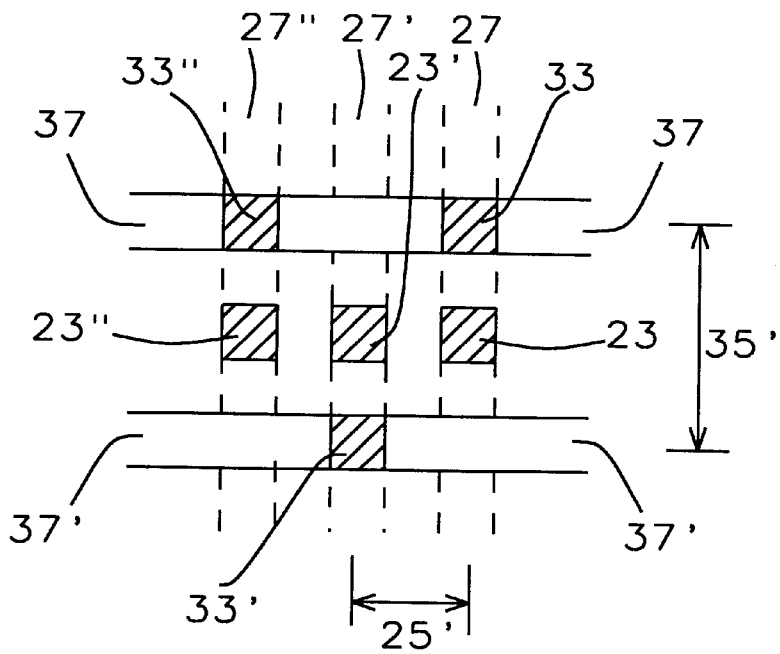
FIG. 2b shows a layout of two levels of metal lines interconnected through staggered and borderless vias of this invention.
Figure 2C:
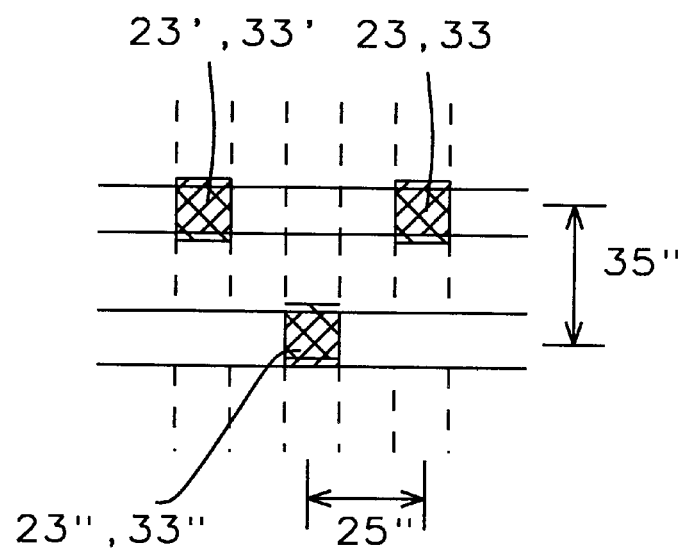
FIG. 2c shows a layout of two levels of metal lines interconnected through stacked and borderless vias of this invention.
Figure 3A:
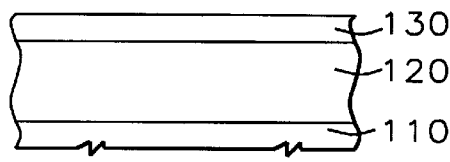
FIG. 3a shows a semiconductor substrate of this invention provided with a dielectric layer and a nitride layer formed thereon.
Figure 3D:
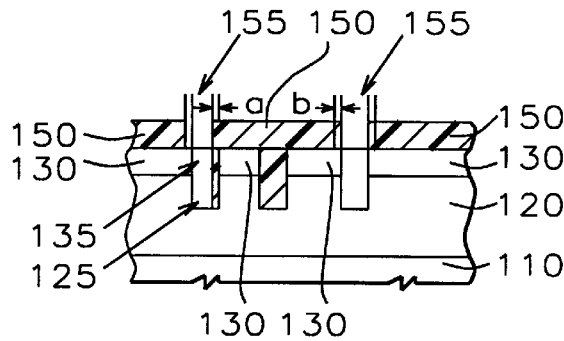
FIG. 3d shows the patterning of a second photoresist layer with contact or via hole openings with relatively large alignment tolerance, according to this invention.

In FIG. 3a, a layer of ILD and/or IMD, (120), is formed over substrate (110) provided with a substructure of devices and/or metal layers. Dielectric layer (120) may be formed from silicon oxide materials through methods including but not limited do CVD, PECVD, PVD sputtering methods. For the preferred embodiment of the present invention, dielectric layer (120) comprises plasma enhanced tetraethyl orthosilicate (PETEOS) which is well known in the art. The preferred thickness of PETEOS is between about 8000 to 1000 angstroms (Å). Next, an etch-stop layer (130) is deposited, preferably, silicon nitride $Si_3N_4$, having a thickness between about 300 to 600 Å. Silicon nitride is formed by reacting dichlorosilane ($SiCl_2H_2$) with ammonia ($NH_3$) in an LPCVD at a pressure between about 0.01 to 0.05 torr, temperature between about 700 to 900° C.

Figure 3B:
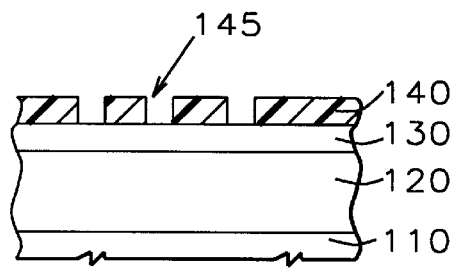
FIG. 3b shows the patterning of a first photoresist layer with line openings, according to this invention.

After the forming of the dielectric and etch-stop layers, a first photoresist layer (140) of a thickness between about 6,000 to 10,000 Å is formed and then patterned with a mask having a metal line pattern (145), as shown in FIG. 3b. The line pattern is next etched into nitride layer (130) and then into dielectric layer (120), forming openings (135) and (125) in the respective layers. The nitride etching is accomplished with a recipe comprising $SF_6$, He and then the recipe is changed to $CF_4$, $CHF_3$, Ar to etch the underlying dielectric layer. An etching rate of about 5000 Å/minute is used. Subsequent to forming of the line pattern in the nitride and dielectric layers, first photoresist layer (140) is removed by conventional oxygen ashing.

At the next step, a second photoresist layer (150) is formed over the substrate including the line pattern therein, with a preferred thickness between about 0.3 to 0.8 micrometers ($\mu$m). As a main feature and key aspect of the present invention, second photoresist layer (150) is patterned with a mask having a contact or via hole pattern with an alignment tolerance higher than which is conventionally practiced. That is, whereas, it is common, as is well-known, to set tolerances as tight as ±5–10% of line width in order to assure acceptable alignment or registration of hole pattern (155) with the line opening (125) already formed in the dielectric layer, the method of this invention allows tolerance (a) shown in FIG. 3d to be as high as ±10–15%. This is because, the method employed in this invention provides self-alignment of hole opening (155) to the line opening (125) in layer (120). Consequently, no border, as is conventionally use, is needed in order to adequately align the contact/via hole opening to the performed metal line opening.

Figure 3E:
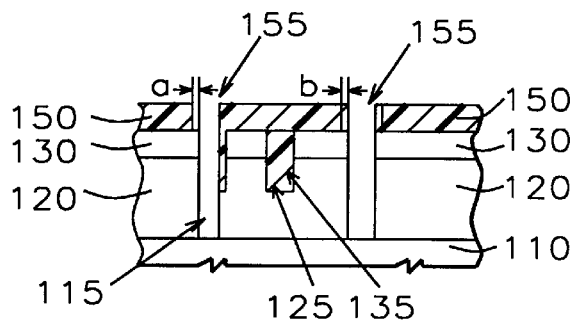
FIG. 3e shows the forming of borderless contact/via hole openings further into the dielectric layer of FIG. 3d, according to this invention.
Figure 3C:
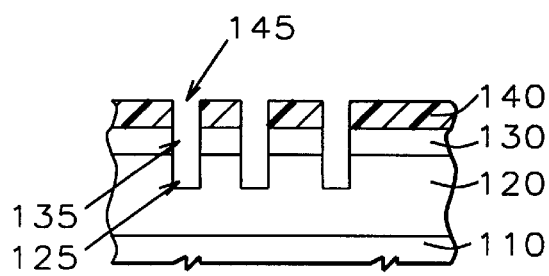
FIG. 3c shows the forming of line openings in the nitride and dielectric layers of FIG. 3b, according to this invention.
Figure 3F:
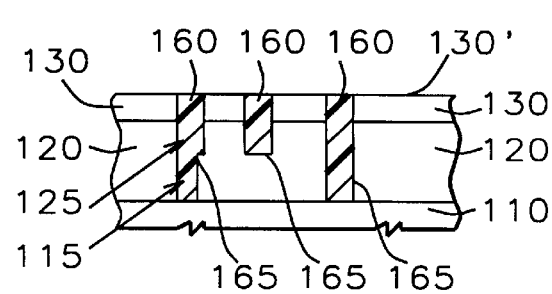
FIG. 3f shows the forming of the dual damascene, composite line and borderless contact/via interconnect of this invention.

Subsequent to patterning of second photoresist layer (155) with a mask having metal line pattern (155), the line pattern is etched into dielectric layer (120) until substructure in substrate (110) is reached. Thus, contact/via hole (115) is formed as shown in FIG. 3e. It will be observed from FIG. 3e that both tolerances (a) and (b) can indeed be wide, in fact wide enough so as to fall outside of the line etch window, because, etch-stop layer containing line pattern (135) in it controls the maximum width to which the hole pattern can be formed by etching. In other words, nitride layer (130) functions as a hard-mask in etching the hole opening. The high selectivity with respect to the nitride hard-mask is provided by etching recipe comprising $CH_2F_2$ and $C_4F_8$.

As another step to forming the composite dual damascene structure of this invention, comprising metal line opening (135) and contact or via hole opening (115) as shown in FIG. 3e, second photoresist in the metal line and hole openings as well as on the surface of the substrate is removed by oxygen ashing. A metal layer, such as aluminum copper is next deposited onto this new damascene structure and chemical mechanical polishing is performed in order to planarize the surface (130') encompassing the metal filled patterns and form the composite conductive line and contact or via hole interconnection (160) shown in FIG. 3f as a preparation for completing the remaining process steps of fabricating the semiconductor substrate. Where tungsten is used as the filler metal, it is preferred that a "glue" layer, as known in the art, comprising titanium (Ti) or titanium nitride (TiN) be used to provide better adhesion between tungsten and the dielectric layer, (120).

While the invention has been particularly shown and described with reference to the preferred embodiments thereof, it will be understood by those skilled in the art that various changes in form and details may be made without departing from the spirit and scope of the invention.

What is claimed is:

1. A method of forming a self-aligned, borderless contact comprising the steps of:
    providing a semiconductor substrate having a substructure comprising devices formed in said substrate;
    forming an interlevel dielectric (ILD) layer over said substrate;
    performing chemical mechanical polishing of said ILD layer;
    forming an hard-mask layer over said ILD layer;
    forming a first photoresist layer over said hard-mask layer;
    patterning said first photoresist layer with a metal line pattern;
    etching through said metal line pattern in said first photoresist layer into said hard-mask layer;
    etching further said metal line pattern into said ILD layer;
    removing said first photoresist layer from said substrate;
    forming a second photoresist layer over said substrate including said metal line opening;
    patterning said second photoresist layer with a contact hole pattern;
    etching through said contact hole pattern in said second photoresist layer into said ILD layer until a lower level said substructure of said substrate is reached;
    removing said second photoresist layer;
    forming a glue layer over said substrate including said metal line and contact hole opening forming a composite opening;
    forming metal in said composite opening in said ILD layer; and
    removing said metal from the surface of said substrate for subsequent process steps to complete the fabrication of a semiconductor substrate.

2. The method of claim 1, wherein said ILD layer comprises plasma enhanced tetraethyl orthosilicate (PETEOS).

3. The method of claim 1, wherein said ILD layer has a thickness between about 8000 to 10000 Å.

4. The method of claim 1, wherein said forming an hard-mask layer over said ILD layer is accomplished by reacting dichlorosilane ($SiCl_2H_2$) with ammonia ($NH_3$) in an LPCVD at a pressure between about 0.01 to 0.05 torr, temperature between about 700 to 900° C.

5. The method of claim 1, wherein said first photoresist layer over said ILD layer has a thickness between about 0.6 to 1.0 micrometers ($\mu$m).

6. The method of claim 1, wherein said patterning said first photoresist layer is accomplished with a mask having said metal line pattern.

7. The method of claim 1, wherein said etching through said metal line pattern in said first photoresist layer into said hard-mask layer is accomplished with a recipe comprising $SF_6$ and He.

8. The method of claim 1, wherein said etching further said metal line pattern into said ILD layer is accomplished with a recipe comprising $CF_4$, $CHF_3$ and Ar.

9. The method of claim 1, wherein said first photoresist layer is removed by oxygen ashing.

10. The method of claim 1, wherein said second photoresist layer over said substrate including said metal line opening has a thickness between about 0.3 to 0.8 $\mu$m.

11. The method of claim 1, wherein said patterning said second photoresist layer is accomplished with a mask having said contact hole pattern.

12. The method of claim 1, wherein said etching through said contact hole pattern in said second photoresist layer into said ILD layer until said substructure of said substrate is reached is accomplished with a recipe comprising gases $CH_2F_2$ and $C_4F_8$.

13. The method of claim 1, wherein said removing said second photoresist layer is accomplished with oxygen ashing.

14. The method of claim 1, wherein said depositing a glue layer over said substrate including said metal line and contact hole opening forming a composite opening is accomplished by depositing Ti or TiN.

15. The method of claim 1, wherein said forming metal in said composite opening in said ILD layer is accomplished by depositing tungsten.

16. The method of claim 15, wherein said removing said metal from the surface of said substrate is accomplished by chemical mechanical polishing.

17. A method of forming a self-aligned, borderless via comprising the steps of:

providing a semiconductor substrate having a substructure comprising metal layers formed in said substrate;

forming an intermetal dielectric (IMD) layer over said substrate;

performing chemical mechanical polishing of said IMD layer;

forming an hard-mask layer over said IMD layer;

forming a first photoresist layer over said hard-mask layer;

patterning said first photoresist layer with a metal line pattern;

etching through said metal line pattern in said first photoresist layer into said hard-mask layer;

etching further said metal line pattern into said IMD layer;

removing said first photoresist layer from said substrate;

forming a second photoresist layer over said substrate including said metal line opening;

patterning said second photoresist layer with a via hole pattern;

etching through said via hole pattern in said second photoresist layer into said IMD layer until a lower level said substructure of said substrate is reached;

removing said second photoresist layer;

forming a glue layer over said substrate including said metal line and via hole opening forming a composite opening;

forming metal in said composite opening in said IMD layer; and removing said metal from the surface of said substrate for subsequent process steps to complete the fabrication of a semiconductor substrate.

18. The method of claim 17, wherein said IMD layer comprises plasma enhanced tetraethyl orthosilicate (PETEOS).

19. The method of claim 17, wherein said IMD layer has a thickness between about 8000 to 10000 Å.

20. The method of claim 17, wherein said forming an hard-mask layer over said IMD layer is accomplished by reacting dichlorosilane ($SiCl_2H_2$) with ammonia ($NH_3$) in an LPCVD at a pressure between about 0.01 to 0.05 torr, temperature between about 700 to 900° C.

21. The method of claim 17, wherein said first photoresist layer over said IMD layer has a thickness between about 0.6 to 1.0 micrometers ($\mu$m).

22. The method of claim 17, wherein said patterning said first photoresist layer is accomplished with a mask having said metal line pattern.

23. The method of claim 17, wherein said etching through said metal line pattern in said first photoresist layer into said hard-mask layer is accomplished with a recipe comprising $SF_6$ and He.

24. The method of claim 17, wherein said etching further said metal line pattern into said IMD layer is accomplished with a recipe comprising $CF_4$, $CHF_3$ and Ar.

25. The method of claim 17, wherein said first photoresist layer is removed by oxygen ashing.

26. The method of claim 17, wherein said second photoresist layer over said substrate including said metal line opening has a thickness between about 0.3 to 0.8 Å.

27. The method of claim 17, wherein said patterning said second photoresist layer is accomplished with a mask having said via hole pattern.

28. The method of claim 17, wherein said etching through said via hole pattern in said second photoresist layer into said IMD layer until said substructure of said substrate is reached is accomplished with a recipe comprising gases $CH_2F_2$ and $C_4F_8$.

29. The method of claim 17, wherein said removing said second photoresist layer is accomplished with oxygen ashing.

30. The method of claim 17, wherein said depositing a glue layer over said substrate including said metal line and via hole opening forming a composite opening is accomplished by depositing Ti or TiN.

31. The method of claim 17, wherein said forming metal in said composite opening in said IMD layer is accomplished by depositing tungsten.

32. The method of claim 17, wherein said removing said metal from the surface of said substrate is accomplished by chemical mechanical polishing.

\* \* \* \* \*